United States Patent
Dong et al.

(10) Patent No.: US 10,286,471 B2
(45) Date of Patent: *May 14, 2019

(54) SOLDER PASTE MISPRINT CLEANING

(71) Applicant: International Business Machines Corporation, Armonk, NY (US)

(72) Inventors: Xingquan Dong, Shenzhen (CN); Yanlong Hou, Shenzhen (CN); LiCen Mu, Shenzhen (CN); Ben Wu, Shenzhen (CN); WeiFeng Zhang, Shenzhen (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/924,484

(22) Filed: Mar. 19, 2018

(65) Prior Publication Data

US 2018/0185944 A1    Jul. 5, 2018

Related U.S. Application Data

(63) Continuation of application No. 15/662,893, filed on Jul. 28, 2017, now Pat. No. 9,956,632, which is a
(Continued)

(51) Int. Cl.
*B23K 3/00* (2006.01)
*B23K 35/22* (2006.01)
(Continued)

(52) U.S. Cl.
CPC ............ *B23K 1/018* (2013.01); *B23K 1/0016* (2013.01); *B23K 3/04* (2013.01); *B23K 3/08* (2013.01);
(Continued)

(58) Field of Classification Search
None
See application file for complete search history.

(56) References Cited

U.S. PATENT DOCUMENTS

| | | | |
|---|---|---|---|
| 4,769,083 A | | 9/1988 | Tiritilli |
| 5,291,535 A | * | 3/1994 | Baker .................. G01N 23/043 378/207 |

(Continued)

FOREIGN PATENT DOCUMENTS

| | | |
|---|---|---|
| CN | 1189066 C | 2/2005 |
| CN | 102513719 A | 6/2012 |

(Continued)

OTHER PUBLICATIONS

"4902P Technical Data Sheet Sn42Bi57Ag1 Low Temperature Solder Paste", MG Chemicals, ISO 9001:2008 Registered Quality System. Burlington, Ontario, Canada SAI Global File: 004008, Date: Nov. 13, 2017 / Ver. 1.02, pp. 1-6.

(Continued)

*Primary Examiner* — Devang R Patel
(74) *Attorney, Agent, or Firm* — Isaac J. Gooshaw

(57) ABSTRACT

A processor receives solder paste information, where the solder paste information describes a solder paste used in assembly of a printed circuit board. A processor determines a minimum magnetic force required for removing the solder paste from the printed circuit board based on the solder paste information. A processor receives electromagnet information, where the electromagnet information describes an electromagnet used in cleaning of a misprint of the solder paste on the printed circuit board. A processor determines a minimum amount of power to provide the electromagnet to induce the minimum magnetic force in the electromagnet, where the determination of the amount of power is based on the electromagnet information and the minimum magnetic force. A processor adjusts an amount of power applied to the (Continued)

electromagnet to at least the determined minimum amount of power to clean the misprint of the solder paste from the printed circuit board.

1 Claim, 4 Drawing Sheets

Related U.S. Application Data continuation of application No. 15/173,751, filed on Jun. 6, 2016.

(51) Int. Cl.
| | |
|---|---|
| H05K 3/22 | (2006.01) |
| B23K 1/018 | (2006.01) |
| B23K 1/00 | (2006.01) |
| B23K 3/04 | (2006.01) |
| B23K 3/08 | (2006.01) |
| B23K 35/26 | (2006.01) |
| B23K 35/30 | (2006.01) |
| B23K 35/36 | (2006.01) |
| B23K 35/02 | (2006.01) |
| B23K 31/02 | (2006.01) |
| B23K 31/12 | (2006.01) |
| H05K 3/34 | (2006.01) |
| B23K 101/42 | (2006.01) |

(52) U.S. Cl.
CPC ............ *B23K 31/02* (2013.01); *B23K 31/12* (2013.01); *B23K 35/02* (2013.01); *B23K 35/025* (2013.01); *B23K 35/0222* (2013.01); *B23K 35/0244* (2013.01); *B23K 35/262* (2013.01); *B23K 35/302* (2013.01); *B23K 35/3006* (2013.01); *B23K 35/3033* (2013.01); *B23K 35/3053* (2013.01); *B23K 35/36* (2013.01); *H05K 3/225* (2013.01); *H05K 3/3484* (2013.01); *B23K 2201/42* (2013.01); *G05B 2219/37215* (2013.01); *G05B 2219/45235* (2013.01); *H05K 3/34* (2013.01); *H05K 2201/083* (2013.01); *H05K 2203/0445* (2013.01); *H05K 2203/104* (2013.01); *H05K 2203/163* (2013.01)

(56) References Cited

U.S. PATENT DOCUMENTS

| | | | |
|---|---|---|---|
| 5,491,871 A | | 2/1996 | Reber et al. |
| 5,621,811 A | * | 4/1997 | Roder ............... G01N 23/043 348/126 |
| 5,751,910 A | | 5/1998 | Bryant et al. |
| 5,809,642 A | * | 9/1998 | Ishihara ............... H05K 3/1233 228/180.21 |
| 5,912,984 A | * | 6/1999 | Michael ............... B23K 3/08 382/149 |
| 6,342,266 B1 | * | 1/2002 | Forsten ............... H05K 3/1233 382/147 |
| 6,357,648 B1 | | 3/2002 | Monno |
| 6,360,940 B1 | | 3/2002 | Bolde et al. |
| 6,378,505 B1 | | 4/2002 | Doering et al. |
| 6,406,988 B1 | | 6/2002 | Chung |
| 6,738,505 B1 | | 5/2004 | Prince |
| 6,915,563 B2 | | 7/2005 | Bolde et al. |
| 7,159,754 B2 | * | 1/2007 | Van Den Broek ... B23K 1/0016 228/102 |
| 7,310,406 B2 | * | 12/2007 | Kuriyama ............. G01N 23/04 250/559.4 |
| 7,931,933 B2 | | 4/2011 | Holm et al. |
| 8,474,714 B1 | | 7/2013 | Grant et al. |
| 9,661,755 B2 | | 5/2017 | Cherbis et al. |
| 9,956,632 B2 | | 5/2018 | Dong et al. |
| 2010/0270364 A1 | | 10/2010 | Sakaguchi et al. |
| 2011/0244145 A1 | | 10/2011 | Wang |
| 2014/0210993 A1 | | 7/2014 | Butler et al. |
| 2017/0348784 A1 | | 12/2017 | Dong et al. |
| 2017/0348785 A1 | | 12/2017 | Dong et al. |
| 2018/0185945 A1 | | 7/2018 | Dong |

FOREIGN PATENT DOCUMENTS

| | | | | |
|---|---|---|---|---|
| CN | 102198566 B | | | 3/2013 |
| CN | 203437787 U | | | 2/2014 |
| JP | 2005026403 A | * | | 1/2005 |

OTHER PUBLICATIONS

"Removal of Inclusions in Solder Joints by Induction Force Using Electromagnetic Fields", An IP.com Prior Art Database Technical Disclosure, IP.com No. 000100652, 5 pages.

IBM Appendix P, "List of IBM Patents or Patent Applications Treated as Related", Dated Mar. 19, 2018, 2 pages.

Dong et al., "Solder Paste Misprint Cleaning", U.S. Appl. No. 15/924,523, filed Mar. 19, 2018, pp. 1-19.

* cited by examiner

SOLDER PASTE MISPRINT CLEANING

The present invention relates generally to the field of printed circuit board assembly, and more particularly to cleaning misprints of solder.

During a printed circuit board (PCB) assembly process, solder is applied to the surface of the PCB to adhere various circuit elements and devices to the PCB. Most PCBs have pads, or areas of exposed copper, for a part to be affixed onto the PCB. However, in some circumstances, the solder is not correctly applied onto a pad of the PCB. This is often referred to as a misprint. When this occurs, the misapplied solder or the entire PCB is cleaned and the solder reapplied.

SUMMARY

Embodiments of the present invention provide a method, system, and program product to clean a misprint of solder paste on a PCB. A processor receives solder paste information, wherein the solder paste information describes a solder paste used in assembly of a printed circuit board. A processor determines a minimum magnetic force required for removing the solder paste from the printed circuit board based, at least in part, on the solder paste information. A processor receives electromagnet information, wherein the electromagnet information describes an electromagnet used in cleaning of a misprint of the solder paste on the printed circuit board. A processor determines a minimum amount of power to provide the electromagnet to induce the minimum magnetic force in the electromagnet, wherein the determination of the amount of power is based, at least in part, on the electromagnet information and the minimum magnetic force. A processor adjust an amount of power applied to the electromagnet to at least the determined minimum amount of power to clean the misprint of the solder paste from the printed circuit board.

DETAILED DESCRIPTION

Figure 1:
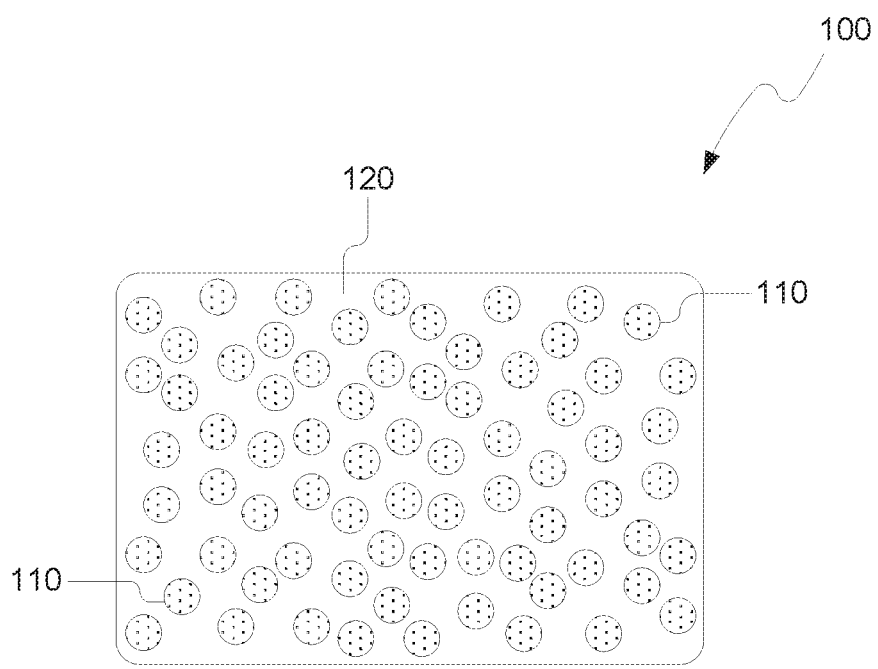
FIG. 1 is a detailed view of a solder paste, in accordance with an embodiment of the present invention.

While solutions to misprint cleaning are known, they typically involve processes that may damage a PCB. One type of known solution is to spray an aqueous solution to remove solder misprint from the PCB. However, the solution may lead to the degradation of organic solderability preservatives (OSP) on the PCB, which provide protection against oxidation of the pads on the PCB. Additionally, disposal and handling of the solution requires additional concerns. Another known solution is the use of ultrasonic sound waves to agitate the solder. Typically, the PCB side with misprinted solder is hung facing downwards and, when ultrasonic waves are applied, the solder falls off the PCB. However, some residual solder may remain, causing shorts or other issues when the PCB is reprinted. Since ultrasonic cleaning solution require gravity to remove the solder, small amounts of solder may remain. Also, the frequencies and power of the ultrasound must be carefully selected or damage to other components on the PCB may be damaged.

Embodiments of the present invention recognize that by using solder paste with magnetic alloys to adhere elements to a PCB, an electromagnet may be used to remove any solder paste that is misprinted. Advantageously, no chemical solutions are necessary, eliminating the environmental concerns of spray cleaning solutions. Additionally, the OSP are preserved and oxidization during re-use of a PCB is no longer a concern. Furthermore, embodiments of the present invention may be used in any orientation with complete removal of solder. Advantageously, this removes the concerns of short circuits caused by the remains of solder in a cleaning process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The present invention will now be described in detail with reference to the Figures. FIG. 1 provides a detailed view of solder paste 100. In various embodiments, solder paste 100 is used for soldering circuit elements and devices to a PCB. Solder paste 100 is applied to pads (i.e., exposed conductive material such as copper) of a PCB to connect the various circuit elements and devices to one another. The various circuit elements and devices are adhered to the PCB via solder paste 100. Afterwards, solder paste 100 is heated to bond the circuit elements and devices to the PCB while providing an electrical connection to the pads. In some scenarios, solder paste 100 is sprayed onto a PCB via a screening process. A stencil, with open portions corresponding to the pads of the PCB, directs the sprayed solder paste 100 onto the pads.

In various embodiments, solder paste 100 comprises metal solder 110 and flux 120. Metal solder 110 is suspended in flux 120. Flux 120 provides an adhesive property to solder paste 100 temporarily holding the circuit elements and devices to the PCB. When heated, metal solder 110 melts, creating a mechanical and electrical bond to the PCB. In various embodiments, metal solder 110 is comprised of one or more metal alloys with magnetic properties. For example, metal solder 110 is selected to include at least one of the following alloys: Tin, Ag, Cu, Ni, Sb, Fe, and the like. One of ordinary skill will appreciate that any metal alloy may be chosen as metal solder 110 without deviating from the invention. In some scenarios, a metal alloy with strong magnetic properties may be selected to aid in the misprint cleaning process as discussed herein.

In some embodiments, metal solder 110 are formed into spherical shapes to provide a lower viscosity to solder paste 100. Typically, the particulates of metal solder 110 range on a size of 5 to 75 microns. In other embodiments, metal solder 110 has an irregular non-spherical shape. Irregular non-spherical shapes prevent shearing and tearing in a screen printing process of applying solder paste 100. One of ordinary skill in the art will appreciate that any size and shape, as well as a mixture of sizes and shapes, may be used for metal solder 110 without deviating from the invention. Based on the desired properties of solder paste 100, one of ordinary skill in the art may select a variety of alloys, shapes and sizes of metal solder 110 without deviating from the invention.

Figure 2:
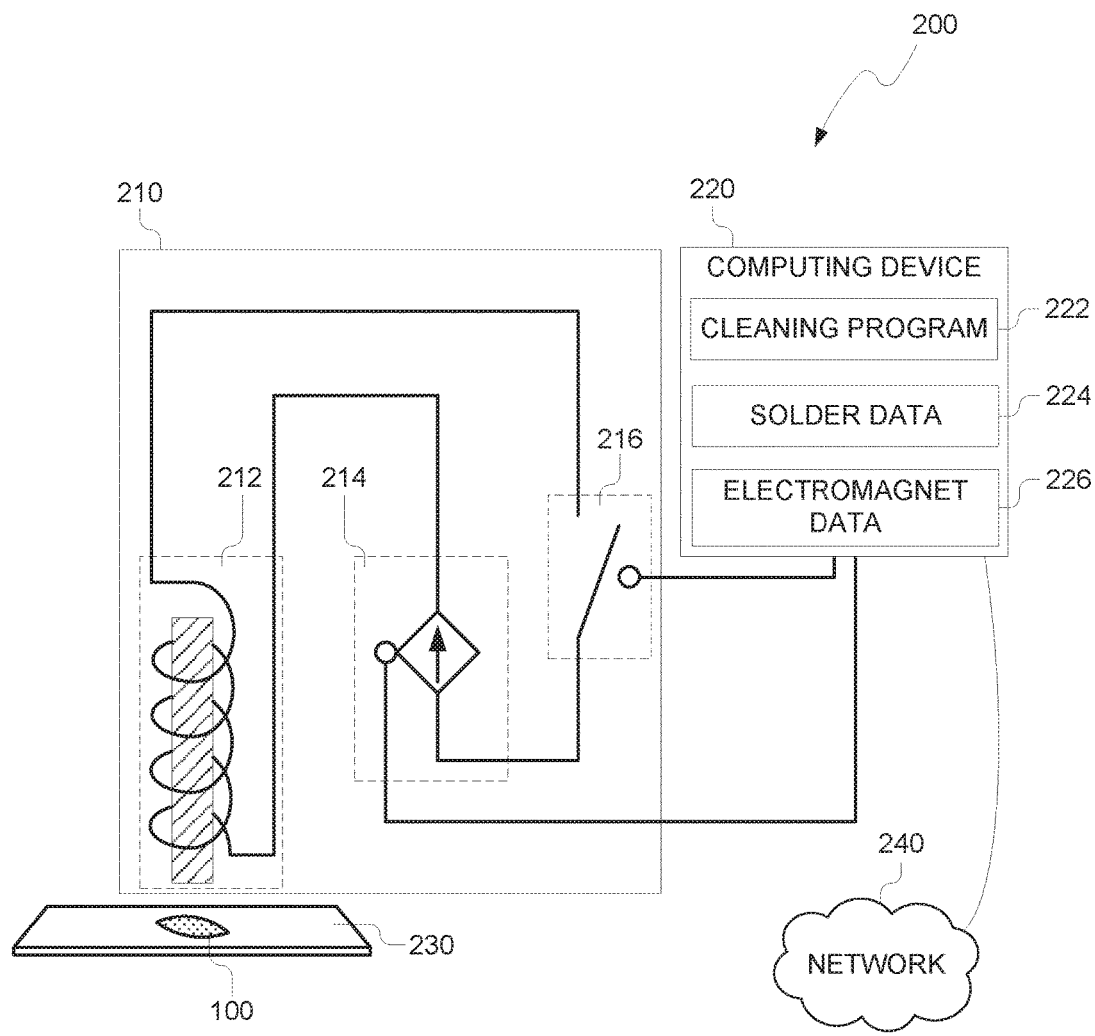
FIG. 2 is a diagram illustrating a misprint cleaning environment, in accordance with an embodiment of the present invention.

FIG. 2 is diagram illustrating cleaning environment, generally designated 200, in accordance with one embodiment of the present invention. Cleaning environment 100 includes cleaning device 210, computing device 220 and misprinted PCB 230. Cleaning device 210 includes electromagnet 212, power source 214 and control circuit 216. Computing device 220 is communicatively coupled to cleaning device 210 to provide control signals to power source 214 and control circuit 216. Computing device 220 includes cleaning program 222, solder data 224, and electromagnet data 226. Misprinted PCB 230 includes at least some solder paste 100 prior to heating and curing.

In various embodiments of the present invention, computing device 220 can be a standalone device, a server, a laptop computer, a tablet computer, a netbook computer, a personal computer (PC), or a desktop computer. In another embodiment, computing device 220 represents a computing system utilizing clustered computers and components to act as a single pool of seamless resources. In general, computing device 220 can be any computing device or a combination of devices with access to cleaning program 222, solder data 224, and electromagnet data 226 and is capable of operating or sending control signals to cleaning device 210. Computing device 220 may include internal and external hardware components, as depicted and described in further detail with respect to FIG. 4.

In various embodiments, cleaning program 222 is stored on computing device 220. However, in other embodiments, cleaning program 222 may be stored externally and accessed through a communication network, such as network 240. Network 240 can be, for example, a local area network (LAN), a wide area network (WAN) such as the Internet, or a combination of the two, and may include wired, wireless, fiber optic or any other connection known in the art. In general, network 240 can be any combination of connections and protocols that will support communications between computing device 220, cleaning device 210 and other devices (not shown), in accordance with a desired embodiment of the present invention.

In various embodiments, cleaning device 210 includes electromagnet 212, power source 214 and control circuit 216. In FIG. 2, power source 214 is depicted as a variable current source to induce a magnetic field in electromagnet 212. The amount of current flowing through electromagnet 212 varies the magnetic force exerted by electromagnet 212. As discussed herein, based on the characteristics of electromagnet 212 and solder paste 100, power source 214 varies the current applied to electromagnet 212 to generate the desired magnetic force to pull solder paste 100 from misprinted PCB 230. One of ordinary skill in the art will appreciate that power source 214 may be any type of circuit or device that will vary power to electromagnet 210, in order to vary the magnetic force generated by electromagnet 210, without deviating from the invention. For example, a variable voltage source may be used as power source 220.

Control circuit 216 controls operation of electromagnet 212, permitting power source 214 to induce a magnetic force in electromagnet 212. In some embodiments and scenarios, cleaning device 210 is coupled to a robotic arm or other moving device (not shown). The robotic arm moves cleaning device 210, and electromagnet 212, to an area or areas above misprinted PCB 230 with misprinted solder paste 100. During travel to and from misprinted areas, control circuit 216 disengages and reengages electromagnet 212 from power source 214. In other embodiments and scenarios, cleaning device 210 is a handheld unit to be used by an operator. While holding cleaning device 210, the operator engages control circuit 216 to engage electromagnet 212. The operator move electromagnet 212 over the areas of misprinted PCB 230 with misprinted solder paste 100, engaging cleaning device 210 to provide a magnetic force from electromagnet 212 to remove the misprinted solder paste 100 from misprinted PCB 230.

In various embodiments, cleaning program 222 determines a required magnetic force of to induce in electromagnet 212 in order to remove misprinted solder paste 100 from PCB 230. Cleaning program 222 determines a minimum magnetic force to remove misprinted solder paste 100 based on the gravitational force applied to the metal solder 110, the gravitational force applied to flux 120, and the adhesive force of flux 120 adhering to PCB 230. By applying a force equal to or greater than the minimum magnetic force, which is the sum of the component, electromagnet 212 removes solder paste 100 from PCB 230 without damaging PCB 230 nor leaving residual solder paste 100 such as other known solutions.

In various embodiments, cleaning program 222 determines a minimum magnetic force for electromagnet 212 based on the following equation:

$$F_m > M_s g + M_f g + F_a$$

Where $F_m$ is the minimum magnetic force, $M_s$ is the mass of solder in the misprinted solder paste 100, $M_f$ is the mass of flux in the misprinted solder paste 100, $F_a$ is the adhesive force of the flux in the misprinted solder paste 100, and g is a gravitational constant. Cleaning program 222 determines the mass of the flux and solder in misprinted solder paste 100 based on the amount of the misprinted solder paste 100 (e.g., volume) present on a pad of PCB 230, a mixture ratio of the flux and solder in solder paste 100, and the density of the flux and solder. Solder data 224 includes the mixture ratio of the solder paste, as well as the densities of the metal solder 110 and flux 120 used in solder paste 100.

In some embodiments and scenarios, solder data 224 includes a pad size associated with the various pads of PCB 230. Based on the pad size and associated solder paste 100 applied to pads of that size, cleaning program 222 determines an amount of misprinted solder paste 100 when cleaning a pad of the identified size. In some scenarios, pad size on a PCB is uniform and the amount of solder paste 100 applied to all pads is uniform. In such scenarios, cleaning program 222 determines the amount of misprinted solder paste 100 to be constant. In other scenarios, different sized pads are present on PCB 230. Based on the identified pad to be cleaned and the size of that pad, cleaning program 222 determines the amount of misprinted solder paste 100.

In other embodiments and scenarios, computing device 210 is communicatively coupled to a camera or other visual inspection device (not shown) to retrieve images of misprinted solder paste 100 on a pad of PCB 230. Based on the retrieved image, cleaning program determines the size of the area covered by misprinted solder paste 100. In some scenarios, solder data 224 includes an average thickness of applied solder paste. Based on the thickness and surface area of the misprinted solder paste, cleaning program 222 determines an amount of misprinted solder paste 100. In some scenarios, cleaning program 222 determines a thickness of misprinted solder paste 100 based on the retrieved images.

In various embodiments, cleaning program 222 determines an amount of power required by power source 214 in order to induce the determine magnetic force in electromagnet 212. Electromagnet data 226 includes information describing the characteristics of electromagnet 212. For example, electromagnet data 226 includes one or more of the following characteristics of electromagnet 212: the number of turns in a coil of electromagnet 212; the length of the coil for electromagnet 212; the material used as a core in electromagnet 212; the permeability of the core used in electromagnet 212; and the size and shape of the core of electromagnet 212. Based on the characteristics of electromagnet 212 stored in electromagnet data 226, cleaning program 222 determines an amount of power require by power source 214 to generate the required magnetic force to remove solder paste 100 from PCB 230. For example, cleaning program 222 determines the amount of current required by power source 214 to generate a magnetic force strong enough to remove solder paste 100 from PCB 230.

In various embodiments, cleaning program 222 adjusts power source 214 to provide the determined power to electromagnet 212 required to remove solder paste 100 from PCB 230. In some embodiments, cleaning program 222 controls a robotic arm to move cleaning device 210 to an area above PCB 230 with misprinted solder paste 100. Once electromagnet 212 is above the misprinted solder paste 100, cleaning program 222 engages control circuit 216 to induce the determined magnetic force in electromagnet 212. In other embodiments, cleaning device 210 is hand operated. An operator adjusts the power of power source 214 to match the determined value by cleaning program 222. The operator moves cleaning device 210 to the area of PCB 230 with misprinted solder paste 100. The operator engages control circuit 216 to induce a magnetic force in electromagnet 212 strong enough to remove misprinted solder paste 100 from PCB 230.

Figure 3:
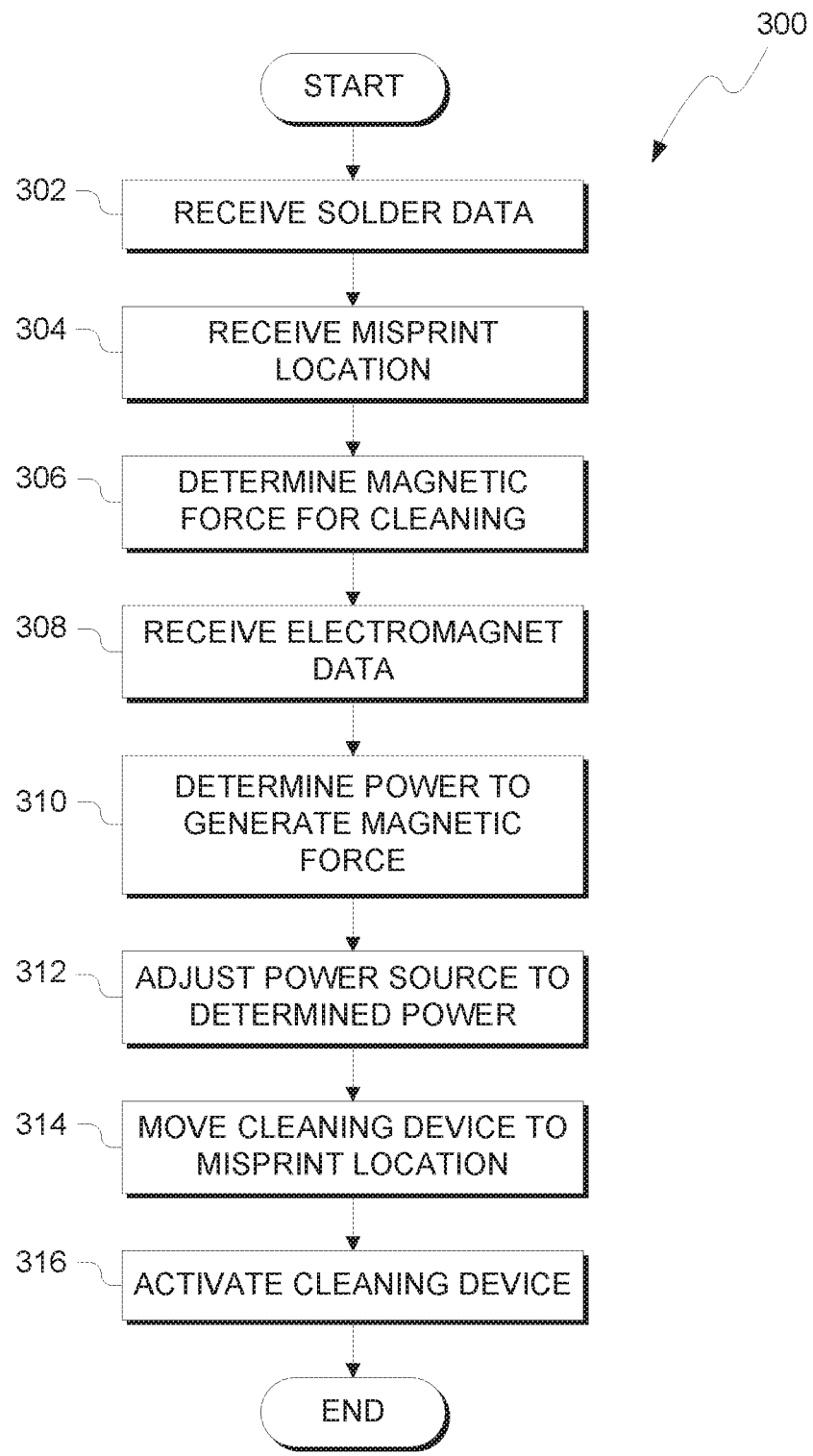
FIG. 3 illustrates operational processes of a cleaning program, on a computing device within the environment of FIG. 2, in accordance with an embodiment of the present invention.

FIG. 3 illustrates operational processes, generally designated 300, of cleaning program 222. In process 302, cleaning program 222 receives solder data 224. Solder data 224 includes information indicating the characteristics of solder paste 100 used on PCB 230. For example, characteristic of solder paste 100 include, but are not limited to, the alloys of metal solder 110, the type of flux 120, the mixture ratio of metal solder 110 and flux 120, the density of the alloys used in metal solder 110, the density of flux 120, the adhesive strength of flux 120, the shape and size of the particulates of metal solder 110, and the amount of solder paste 100 used per application to PCB 230 or an amount associated with a pad or pads of a certain size. In process 304, cleaning program 222 receives a location of misprinted solder paste 100 on PCB 230. In some embodiments and scenarios, cleaning program 222 is provided a coordinate (e.g., x and y location) on PCB 230 for cleaning a misprint. In other embodiments and scenarios, cleaning program 222 is provided a pad identifier or information indicating a pad of PCB 230 where a misprint occurred. Cleaning program 222 identifies the location of the misprint based on the received pad identifier.

In process 306, cleaning program 222 determines a minimum magnetic force required to remove misprinted solder paste 100 from PCB 230. Based on solder data 224 and the amount of solder paste 100 to be removed, cleaning program 222 determines a strength of a magnetic force required to remove the solder paste 100. In process 308, cleaning program 222 receives electromagnet data 226. Electromagnet data 226 includes information indicating the characteristics of electromagnet 212. For example, electromagnet data 226 includes, but is not limited to, the following: the number of turns in a coil of electromagnet 212; the length of the coil for electromagnet 212; the material used as a core in electromagnet 212; the permeability of the core used in electromagnet 212; and the size and shape of the core of electromagnet 212. Based on electromagnet data 226, cleaning program 222 determines an amount of power required to generate the magnetic force determined in process 306 (process 310).

In process 312, cleaning program 222 adjusts power source 214 to the determined power in process 310. In process 314, cleaning program 222 moves cleaning device 210 to the misprint location. Cleaning program 222 positions cleaning device 210 such that electromagnet 212 is above the misprinted solder paste 100. In process 316, cleaning program 222 activates cleaning device 210 by engaging control unit 216. Control unit 216 provides power from power source 214 to electromagnet 216. When provided the determined power in process 310, electromagnet 212 generates the magnetic force determined in process 306, which in turn produces a magnetic force strong enough to lift the misprinted solder paste 100 from PCB 230. In some embodiments and scenarios, more than one misprint location is received in process 304. Under such scenarios, cleaning program repeats processes 306 to 316 for each misprint location. If different types or amounts of solder paste 100 are used, then cleaning program 222 changes the power of power source 214 to correspond to the required magnetic force for each misprint location.

In some embodiments and scenarios, cleaning program 222 receives one or more images of PCB 230. Additionally, cleaning program 222 receives one or more images of PCBs with correctly printed solder paste. Based of comparisons of images of the currently evaluated PCB 230 and known correctly printed PCBs, cleaning program 222 determines the locations of misprinted solder paste 100. By visually inspecting PCBs during the assembly process, cleaning program 222 determines the locations of misprints automatically. In such embodiments and scenarios, cleaning device 210 is connected to a controllable robotic arm. Cleaning program 222 sends signals or instruction to the robotic arm to move the cleaning device 210 and electromagnet 212 over the identified misprints by computer vision. Once over the misprints, cleaning program 222 engages control unit 216 to activate electromagnet, thereby automatically cleaning PCB 230.

Figure 4:
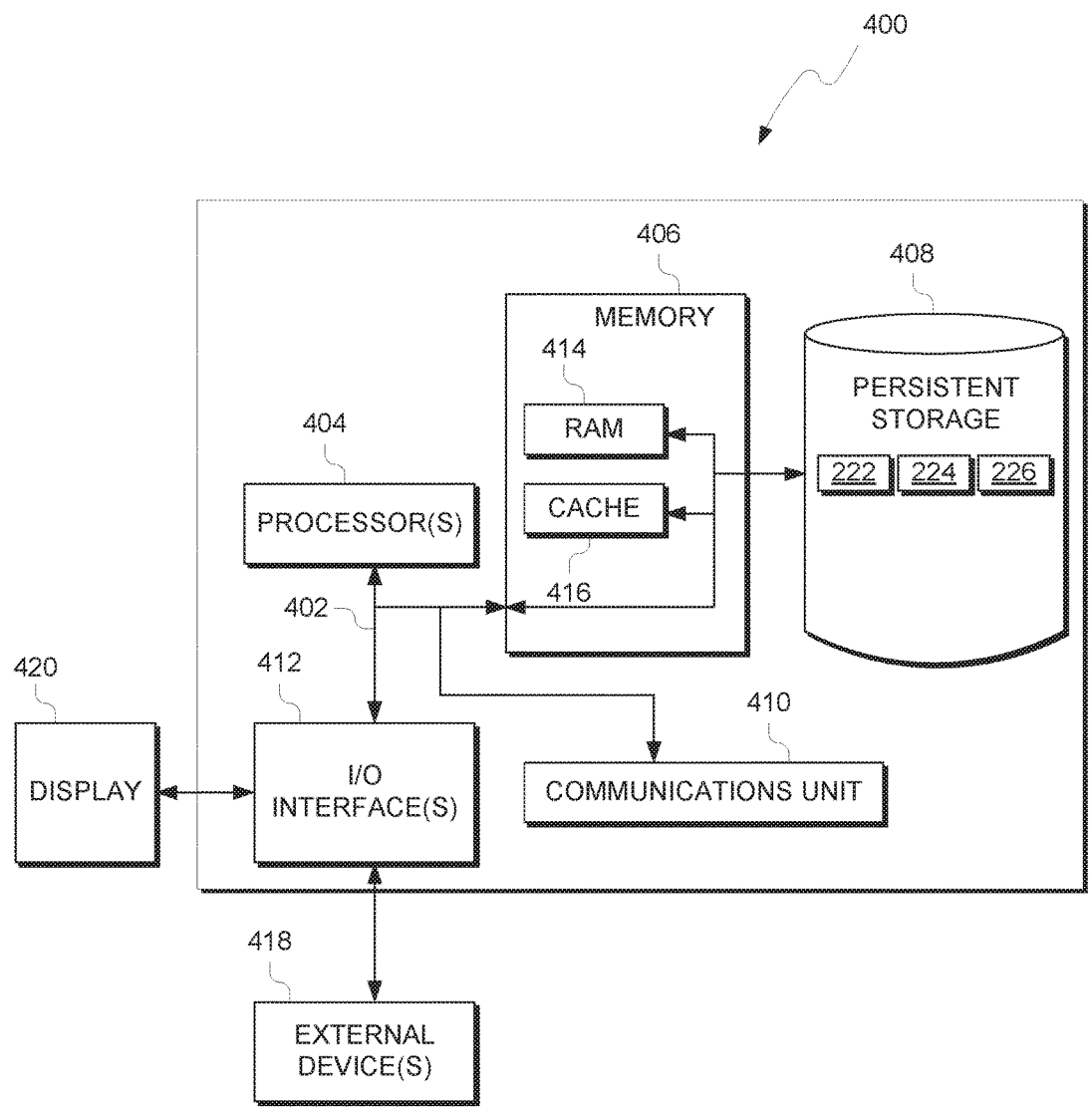
FIG. 4 depicts a block diagram of components of the computing device executing a cleaning program, in accordance with an embodiment of the present invention.

FIG. 4 depicts a block diagram, 400, of components of computing device 220, in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

Computing device 220 includes communications fabric 402, which provides communications between computer processor(s) 404, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In this embodiment, memory 406 includes random access memory (RAM) 414 and cache memory 416. In general, memory 406 can include any suitable volatile or non-volatile computer-readable storage media.

Cleaning program 222, solder data 224 and electromagnet data 226 are stored in persistent storage 408 for execution and/or access by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer-readable storage medium that is also part of persistent storage 408.

Communications unit 410, in these examples, provides for communications with other data processing systems or devices, including resources of network 240. In these examples, communications unit 410 includes one or more network interface cards. Communications unit 410 may provide communications through the use of either or both physical and wireless communications links. Cleaning program 222, solder data 224 and electromagnet data 226 may be downloaded to persistent storage 408 through communications unit 410.

I/O interface(s) 412 allows for input and output of data with other devices that may be connected to computing device 220. For example, I/O interface 412 may provide a connection to external devices 418 such as a keyboard, keypad, a touch screen, and/or some other suitable input device. External devices 418 can also include portable computer-readable storage media such as, for example, thumb drives, portable optical or magnetic disks, and memory cards. Software and data used to practice embodiments of the present invention, e.g., cleaning program 222, solder data 224 and electromagnet data 226, can be stored on such portable computer-readable storage media and can be loaded onto persistent storage 408 via I/O interface(s) 412. I/O interface(s) 412 also connect to a display 420.

Display 420 provides a mechanism to display data to a user and may be, for example, a computer monitor, or a television screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

It is to be noted that the term(s) "Smalltalk" and the like may be subject to trademark rights in various jurisdictions throughout the world and are used here only in reference to the products or services properly denominated by the marks to the extent that such trademark rights may exist.

What is claimed is:

1. A computer program product comprising:
one or more computer-readable storage media and program instructions stored on the one or more computer-readable storage media, the program instructions comprising:
program instructions to receive solder paste information, wherein solder paste information includes (i) a density of a metal solder in a solder paste, (ii) a density of a flux in the solder paste, (iii) an adhesive force of the flux, and (iv) at least one magnetic property of the metal solder;
program instructions to receive electromagnet information, wherein the electromagnet information describes an electromagnet used in cleaning of a misprint of the solder paste on the printed circuit board;
program instructions to receive an image of the printed circuit board;
program instructions to compare the image of the printed circuit board to a second image, wherein the second image depicts a printed circuit board with correctly printed solder paste;
program instructions to determine at least one misprint location of the solder paste on the printed circuit board when at least one misprint is detected in response to the comparison of the image of the printed circuit board and the second image;
program instructions to move the electromagnet to the at least one misprint location;
program instructions to determine an amount of solder paste present in the at least one misprint location, wherein the determination of the amount of solder paste present in the at least one misprint location is based on the image of the at least one misprint location and the solder paste information;
program instructions to determine a component force applied to the solder paste based on the amount of solder paste present in the at least one misprint location and the solder paste information;
program instructions to determine a minimum amount of power to provide the electromagnet to induce a minimum magnetic force in the electromagnet, wherein the determination of the minimum magnetic force is based on an equation: $F_m > M_s g + M_f g + F_a$, wherein $F_m$ is the minimum magnetic force, $M_s$ is the mass of metal solder in the at least one misprint location, $M_f$ is the mass of the flux in the at least one misprint location, $F_a$ is an adhesive force of the flux, and g is a gravitational constant;
program instructions to adjust an amount of power applied to the electromagnet to at least the determined minimum amount of power to clean the misprint of the solder paste at the at least one misprint location from the printed circuit board; and
program instructions to activate the electromagnet, wherein the electromagnet removes the solder paste from the at least one misprint location upon activation.

* * * * *